United States Patent
Kim et al.

(10) Patent No.: US 7,596,038 B2
(45) Date of Patent: **\*Sep. 29, 2009**

(54) FLOATING BODY CONTROL IN SOI DRAM

(75) Inventors: Hoki Kim, Hopewell Junction, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/954,468

(22) Filed: Dec. 12, 2007

(65) Prior Publication Data

US 2009/0154258 A1    Jun. 18, 2009

(51) Int. Cl.
  *G11C 11/406* (2006.01)
  *G11C 11/24* (2006.01)

(52) U.S. Cl. ............... 365/189.09; 365/149; 365/210.1; 365/222

(58) Field of Classification Search ............... 365/210.1
See application file for complete search history.

(56) References Cited

U.S. PATENT DOCUMENTS

| | | | |
|---|---|---|---|
| 4,370,737 A | 1/1983 | Chan | |
| 5,392,240 A | 2/1995 | Muraoka | |
| 5,822,264 A | 10/1998 | Tomishima et al. | |
| 6,097,649 A * | 8/2000 | Chiang et al. | 365/203 |
| 7,440,353 B2 * | 10/2008 | Kim et al. | 365/222 |
| 7,480,201 B2 * | 1/2009 | Bartley et al. | 365/230.02 |

OTHER PUBLICATIONS

U.S. Appl. No. 11/534,070, entitled "Floating Body Control in SOI DRAM" filed on Sep. 21, 2006, First Named Inventor: Hoki Kim.

* cited by examiner

*Primary Examiner*—Tan T. Nguyen
(74) *Attorney, Agent, or Firm*—Scully, Scott, Murphy & Presser, P.C.; Yuanmin Cai

(57) ABSTRACT

A system including a DRAM memory device on an integrated circuit (IC) using a control logic device to initiate a body refresh operation to provide a means for maintaining a low voltage at a floating body and discourage data loss, and a design structure including the DRAM memory device embodied in a machine readable medium is provided. A plurality of DRAM cells are connected to a first word line circuit and a first bit line circuit. The control logic device is coupled to the DRAM memory device and the IC for initiating the body refresh cycle. The control logic communicates with a first bit line and word line circuits and communicates with a reference word line and bit line circuits. A sense amplifier circuit and signal is provided for amplifying the voltage at the first bit line and the reference bit line. The body refresh cycle includes deactivating the first word line voltage while the first bit line and reference bit line voltages continue.

7 Claims, 3 Drawing Sheets

FLOATING BODY CONTROL IN SOI DRAM

RELATED APPLICATION

This application is related to co-pending and co-assigned U.S. patent application Ser. No. 11/534,070, filed Sep. 21, 2006, currently pending.

FIELD OF THE INVENTION

The present invention relates to semiconductor memory devices, and more particularly, to a dynamic random access memory (DRAM) device having an SOI (Silicon On Insulator) structure in which a memory cell is formed on an insulation layer, and a design structure including the DRAM device embodied in a machine readable medium.

BACKGROUND OF THE INVENTION

Currently, semiconductor dynamic random access memory (DRAM) memory devices are available for silicon on insulator SOI and for complementary metal-oxide semiconductor (CMOS) integrated circuits (IC)s. An SOI type thin film transistor is used as a component in three-dimensional integrated circuits and liquid crystal displays. The SOI type thin film transistor includes a power source/drain region or active region formed at a semiconductor Layer on a semiconductor substrate with an insulation film thereunder, In SOI integrated circuits, the active region is isolated from the semiconductor substrate. The SOI type thin film transistor includes a junction capacitance of the active region that is extremely small allowing operation at high speeds with low power consumption. SOI type thin film transistors, such as, metal oxide semiconductor field-effect transistors (thin film SOIMOSFET) may include a 1 G bit (gigabit) DRAM (dynamic random access memory).

U.S. Pat. No. 5,822,264 ('264 patent) to Tomishima et al. discloses a dynamic semiconductor memory device with SOI structure and body refresh circuitry. Essentially, the body refresh operation discharges majority carriers which are stored in a floating body region. A floating body effect is an effect of dependence of the body potential of a transistor. The transistor's body forms a capacitor against the insulated substrate. The charge accumulates on the capacitor and may cause adverse effects, such as, opening of parasitic transistors in the structure and causing off-state leakages, resulting in higher current consumption and in case of a DRAM cell, loss of information from the memory cells. Thus, parasitic floating-body effects are generally associated with partially depleted transistors.

The '264 patent discloses a body refresh function in addition to data refresh operation. The '264 patent discloses a write circuitry including column select circuitry to provide a body refresh potential or GND (ground) to each bit line during the body refresh period.

Typically, high performance DRAM cells with SOI access transistors have a high leakage rate and thereby lose data through sub-threshold leakage. As a result, a ground (GND) pre-charge scheme that keeps the BL/BLB (bit line, and bit line bar) at GND during a retention period will destroy high data (logic 1) on the DRAM cell node. Alternatively, a voltage (VDD) pre-charge scheme that holds BL/BLB at a specified VDD during a retention period can hold data longer. VDD pre-charge can reduce the cell leakage through a surface channel of a cell access transistor while GND pre-charge may loose data during a retention period.

In another example of the VDD pre-charge scheme, the bit line (BL) or bit line bar (BLB) connected to high data containing cells are kept at a pre-charge state (high voltage) until the BL and BLB are pulled down (reduced to zero). When both the bit line and cell node have a high voltage, the potential of the floating body is high. This results in high leakage current when the bit line or bit line bar (reference bit line) is pulled down (reduced to zero). The occurrence of high current leakage may result in data destruction.

Another example of a GND sensing scheme is when the BL or BLB is connected to high data containing cells which keeps the pre-charge state, i.e. GND level, without toggling. This scenario results in continuous leakage and results in lower data retention time.

However, in a VDD (voltage) pre-charge scheme in which the BL or BLB keeps the VDD level while maintaining high data on a cell node, the floating body is charged to a high voltage due to junction leakage current from the source and drain of the cell access transistor. Assuming a long enough time to charge the floating body, floating body potential can be close to VDD. This leads to destruction of the stored data because the increased floating body increases channel leakage. Therefore, keeping body potential at a low level is desirable for a VDD pre-charge scheme.

In a GND pre-charge scheme, the pre-charge state of BL is GND and is intended to automatically refresh the body. However, both GND and VDD pre-charge schemes increase the body potential and lead to short retention of data. The VDD pre-charge scheme prevents high data loss while the BL is in pre-charge state, but requires refreshing the floating body to achieve data retention. Thus, data in a typical DRAM cell is susceptible to leakage resulting in loss of data. It would therefore be desirable to solve the problem of retention of data in a SOI-DRAM cell on an integrated circuit.

SUMMARY OF THE INVENTION

The invention relates to a DRAM memory device for use in an integrated circuit (IC) which comprises a memory array. The memory array includes a plurality of first DRAM cells connected to a first word line circuit and a bit line circuit or bit line bar circuit. A plurality of second DRAM cells are connected to the bit line circuit or bit line bar circuit and a second word line circuit. A plurality of reference DRAM cells are connected to a reference word line circuit and the bit line circuit or bit line bar circuit. A first power supply supplies a voltage to the DRAM cells, the bit line circuit, and the first word line. A second power supply for supplying a reference voltage to the reference DRAM cells and reference bit line circuit wherein the reference bit line voltage is different from the bit line voltage. Control logic is coupled to the DRAM memory device and the IC for providing normal DRAM cycle operation and initiating a body refresh cycle. The control logic generates a word line signal, a bit line control signal, a bit line bar control signal, and a reference word line signal. A sense amplifier circuit amplifies the signal voltage at the bit line circuit and the bit line bar circuit. The control logic is adapted to generate a body refresh cycle periodically wherein the voltage supplied to the first word line is deactivated while the bit line and bit line bar voltages continue, and the control logic is adapted to re-activate the first word line voltage.

In a related aspect of the invention, the reference word line circuit and bit line circuit communicate with the first word line circuit.

In a further aspect of the invention, a method for a body refresh cycle of a DRAM memory device coupled to an integrated circuit (IC) comprises providing a word line signal, a bit line signal, a bit line bar signal, a sense amplifier signal, and a control signal for initiating the body refresh cycle. A body refresh cycle is initiated via the control signal and the word line signal is deactivated. The bit line voltage signal continues, and the word line signal is re-activated.

In a related aspect of the invention the word line signal is deactivated for a short duration, e.g., two clock cycles, such that the first cycle refreshes the bit line and the second cycle refreshes the bit line bar.

In another aspect of the invention, a design structure embodied in a machine readable medium is also provided that includes:
- a memory array including a plurality of first DRAM cells connected to a first word line circuit and a bit line circuit or bit line bar circuit;
- a plurality of second DRAM cells connected to the bit line circuit or bit line bar circuit and a second word line circuit;
- a plurality of reference DRAM cells connected to a reference word line circuit and the bit line circuit or bit line bar circuit;
- a first power supply for supplying a voltage to the DRAM cells, the bit line circuit, and the first word line;
- a second power supply for supplying a reference voltage to the reference DRAM cells and reference bit line circuit wherein the reference bit line voltage is different from the bit line voltage;
- control logic communicating with the DRAM memory device and the IC for providing normal DRAM cycle operation and initiating a body refresh cycle, and the control logic generates a word line signal, a bit line control signal, a bit line bar control signal, and a reference word line signal;
- a sense amplifier circuit which amplifies the signal voltage at the bit line circuit and the bit line bar circuit; and
- the control logic adapted to generate the body refresh cycle periodically, wherein the voltage supplied to the first word line is deactivated while the bit line and bit line bar voltages continue, and the control logic is adapted to re-activate the first word line voltage.

In another aspect of the invention, a design structure embodied in a machine readable is also provided that includes:
- a memory array including a plurality of first DRAM cells connected to a first word line circuit and a bit line circuit or bit line bar circuit;
- a plurality of second DRAM cells connected to the bit line circuit or bit line bar circuit and a second word line circuit;
- a plurality of reference DRAM cells connected to a reference word line circuit and the bit line circuit or bit line bar circuit;
- a first power supply for supplying a voltage to the DRAM cells, the bit line circuit, and the first word line;
- a second power supply for supplying a reference voltage to the reference DRAM cells and reference bit line circuit wherein the reference bit line voltage is different from the bit line voltage;
- control logic communicating with the DRAM memory device and the IC for providing normal DRAM cycle operation and initiating a body refresh cycle, and the control logic generates a word line signal, a bit line control signal, a bit line bar control signal, and a reference word line signal;
- a sense amplifier circuit which amplifies the signal voltage at the bit line circuit and the bit line bar circuit;
- the control logic adapted to generate the body refresh cycle periodically wherein the voltage supplied to the first word line is deactivated while the bit line and bit line bar voltages continue, and the control logic is adapted to re-activate the first word line voltage; and
- wherein the reference word line circuit and bit line circuit communicate with the first word line circuit, and wherein the control logic communicates to the sense amplifier circuit to amplify the signal voltage.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

An embodiment of the present invention is described herein with reference to the accompanying drawings. In general, transistors used in the embodiment described herein may be formed on a single semiconductor substrate such as that made of a single crystal silicon by known integrated circuit technologies such as a CMOS transistor (complementary metal-oxide semiconductor) and the like, or silicon on insulator (SOI) techniques.

The present invention provides a system and method for implementing a floating body refresh cycle for a VDD or VDD/2 (half of the VDD) pre-charge scheme. The present invention may be used with high leakage, high performance silicon on insulator (SOI) dynamic random access memory (DRAM) cell design. A DRAM cell typically has a read/write operation and a data refresh operation. The present invention adds a body refresh operation whereby the floating body is refreshed. When the floating body is not refreshed and the voltage is maintained at a specified amount, cell data loss can occur. Thus, the present invention provides a means for maintaining a low voltage at the floating body and thus prevents cell data loss.

To protect cell data in conditions where there exists high leakage rate of transistors, the present invention provides a floating body refresh system or method. Generally, the present invention provides, a body refresh, i.e., to refresh a floating body by pulling down the floating body close to ground level. The floating body is refreshed by using a signal to initiate a body refresh function. A body refresh function improves a data refresh of dynamic random access memory (DRAM) memory, According to an embodiment of the present invention, one body refresh cycle refreshes half the bit line in a cell array. Thus, the refresh cycle requires only two body refresh cycles per array during the body refresh period, and thereby, memory availability is increased and refresh power is reduced.

Figures 1, 2:
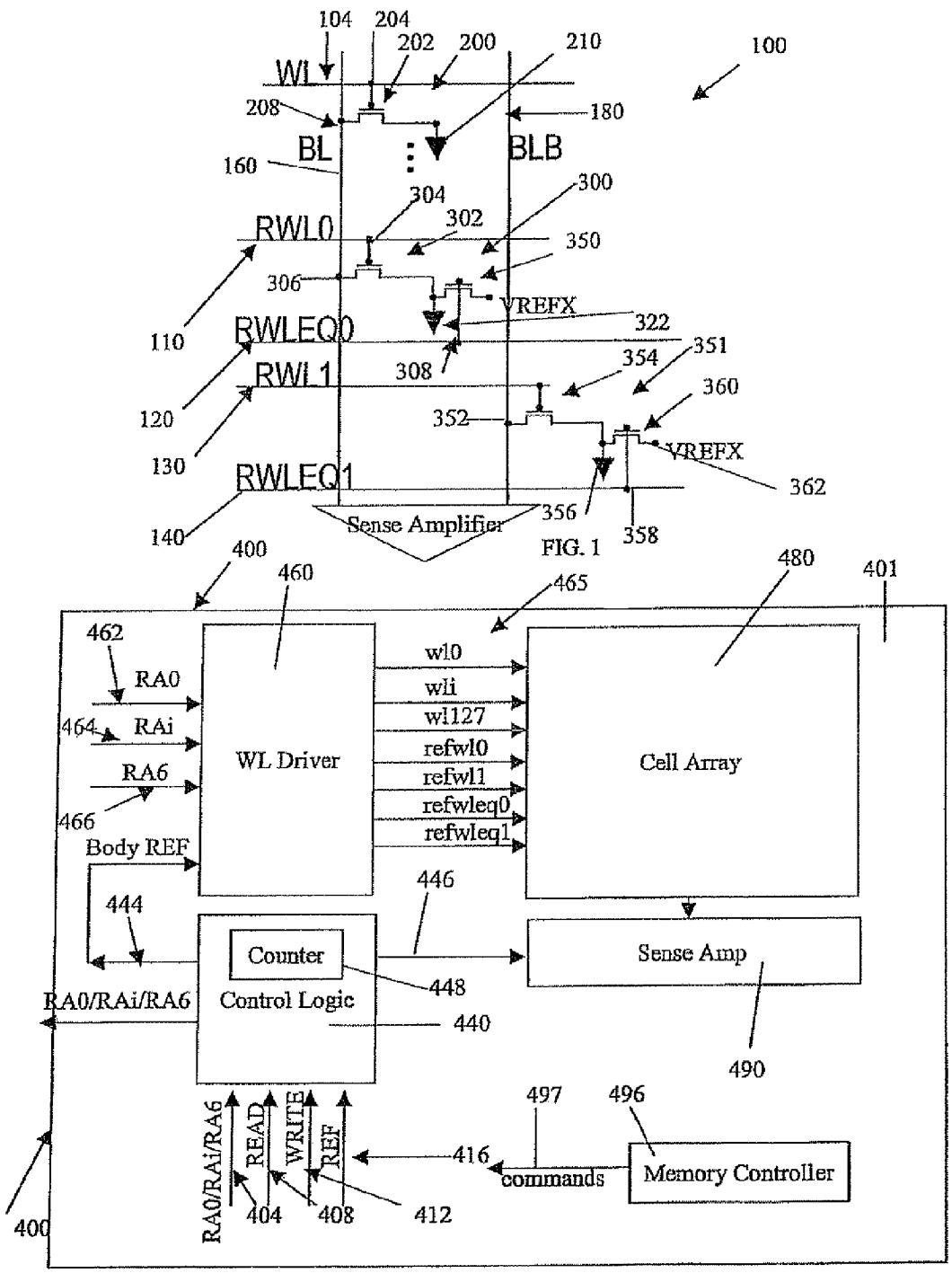
FIG. 1 is an exemplary schematic diagram of a DRAM cell.
FIG. 2 is an exemplary block diagram of a DRAM system.

Referring to FIG. 1, an example DRAM (dynamic random access memory) cell circuit design 100 is shown which is part of the DRAM memory device on an integrated circuit (IC or chip) 401 (shown in FIG. 2). The DRAM cell 100 includes a word line circuit (WL) 104 which may be connected to a plurality of cells. A voltage power source from the IC 401 (shown in FIG. 2) is connected to the DRAM cell 100 and supplies power to the WL 104 and a bit line circuit (BL) 160. Access to the cell 100 is enabled by the WL 104. The counter 448 (shown in FIG. 2) counts the body refresh interval by using a normal refresh command.

The DRAM cell 100 includes a memory cell circuit 200 having a transistor 202, and reference cells 300, 351. In memory cell 200, transistor 202 is connected to the WL 104 at node 204. A capacitor 210, for storing data, is connected to the BL 160 at node 208.

A multiplicity of memory cells 100 comprise a memory cell circuit array 480 (shown in FIG. 2). For VDD sensing, reference cells are grouped to make the reference word line (RWL0) 110. The body refresh cycle according to the invention uses reference cells to refresh the floating body by deactivating or pulling down to ground, i.e. "0" voltage, the bit line (BL) 160 or bit line complement or bar (BLB) 180, respectively. The body refresh command is generated internally by using a counter 448 which is part of control logic 440 (shown in FIG. 2).

Referring to FIG. 1, reference cell circuit 300 includes a transistor 302 connected to the reference write line (RWL0) 110 at node 304 and to the BL 160 at node 306. Transistor 350 is connected to the line RWLEQ0 120 at node 308. A capacitor 322 is positioned between the transistors 302 and 350. Reference cell 351 includes transistors 354 and 360. The transistor 354 is connected to the BL 160 at node 352 and the RWLEQ1 140 at 358. A capacitor 356 is positioned between the transistors 354 and 360. A reference cell circuit 351 includes a capacitor 356 and the transistor 354 is connected to the BLB at node 352. VREFX 362, reference voltage (second power supply), is connected to transistor 360.

Referring to FIG. 2, a block diagram 400 is shown depicting the components of an embodiment of the present invention. The IC 401 includes a control logic 440 having a counter 448 and inputs 404, 408, 412, and 416. Input 404 is a row address to activate a word line. Input 408 is a read command, input 412 is a write command, and input 416 is a refresh command. The commands 497 are from a memory controller 496 on the chip 401.

A body refresh signal 444 is initiated by the control logic 440 to the WL driver 460. A signal 446 is also initiated by the control logic to the sense amplifier 490. The sense amp 490 amplifies the small signal at the bit line 160 and bit lineB 180.

The WL driver 460 has inputs 462, 464, and 466. Input 462 is a row address 0 (the least significant bit). Input 464 is a row address "i", indicating a finite number of inputs ("i"th row address bit). Input 466 is a row address six (6) (the most significant bit). The WL driver 460 provides for signals 465 to the cell array 480. The signals 465 are connected to the cells. The cell array 480 comprises a matrix of DRAM cells as depicted in FIG. 1.

Figure 3:
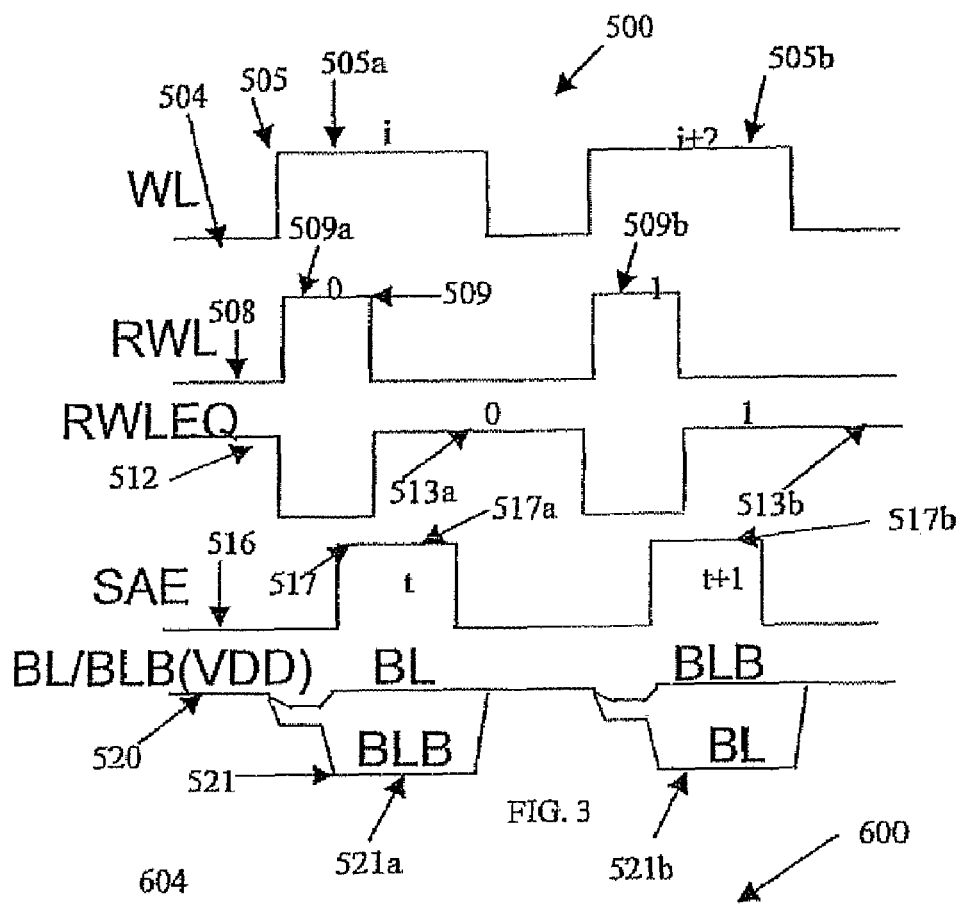
FIG. 3 is a signal diagram before implementing the refresh mode according to the present invention.

FIG. 3 shows DRAM cell signals 500 during normal access. The BL and BLB signals 520 are at a high level and cannot be discharged without losing data in a DRAM cell. The WL signal 504 is activated and displays a normal signal at a specified voltage level 505 at steps 505a and 505b. Step 505a and step 505b activate the word line t=i and t=i+2. Simultaneously, the RWL signal 508, RWLEQ signal 512 at step 509a and 509b are activated corresponding to the two different word line locations i and i+2, and SAE signal 516, i.e. sense amplifier enabling signal, is activated to amplify a normal signal. The RWL signal 508 reaches voltage level 509 enabling RWL0 at 509a and reaches voltage level 509 enabling RWL1 at 509b. The RWLEQ signal 512 enables RWLEQ0 at 513a and RWLEQ1 at 513b. The SAE signal 516 reaches a specified voltage 517 at "t" 517a and "t+1" 517b. The BL/BLB (Vdd) signal 520 reaches a specified voltage 521 at "t" 521a and "t+1" 521b.

Figure 4:
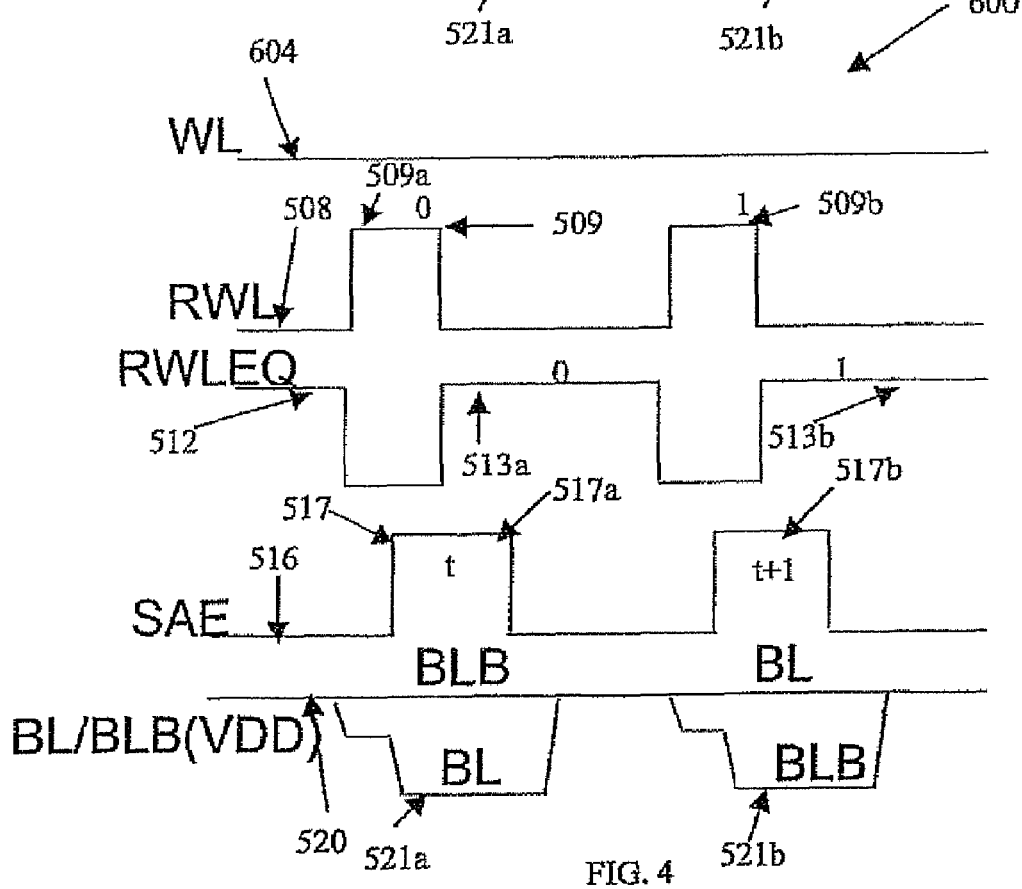
FIG. 4 is a signal diagram during the refresh mode according to the present invention.

Referring to FIG. 4, the DRAM cell 100 (shown in FIG. 1) is in body refresh cycle or body refresh mode, The WL signal 604 is deactivated, i.e., the voltage is "0" or grounded. The RWL signal 508 and RWLEQ signal 512, and SAE signal 516 continues to be activated as the DRAM cell is in body refresh mode, as shown in FIGS. 3 and 4. After the body refresh mode is complete, the control logic 440 (shown in FIG. 2) reactivates the WL and the cell signals return to those shown in FIG. 3.

In the DRAM cell 100 (shown in FIG. 1), half of the cell is connected to the bit line 160 (BL) and half of the cell 100 is connected to the bit line bar 180 (BLB). In a first cycle, the BLB 180 is pulled down to ground, i.e. "0" voltage. In a second cycle the BL is pulled down to ground, i.e., "0" voltage. Thus, the body is refreshed in two cycles, one half of the cell 100 in each cycle.

Thus, during a typical DRAM cell read write operation and a data refresh operation, the present invention adds a body refresh operation whereby the floating body is refreshed. Thus, the present invention provides a means for maintaining a low voltage at the floating body and discourage data loss.

Figure 5:
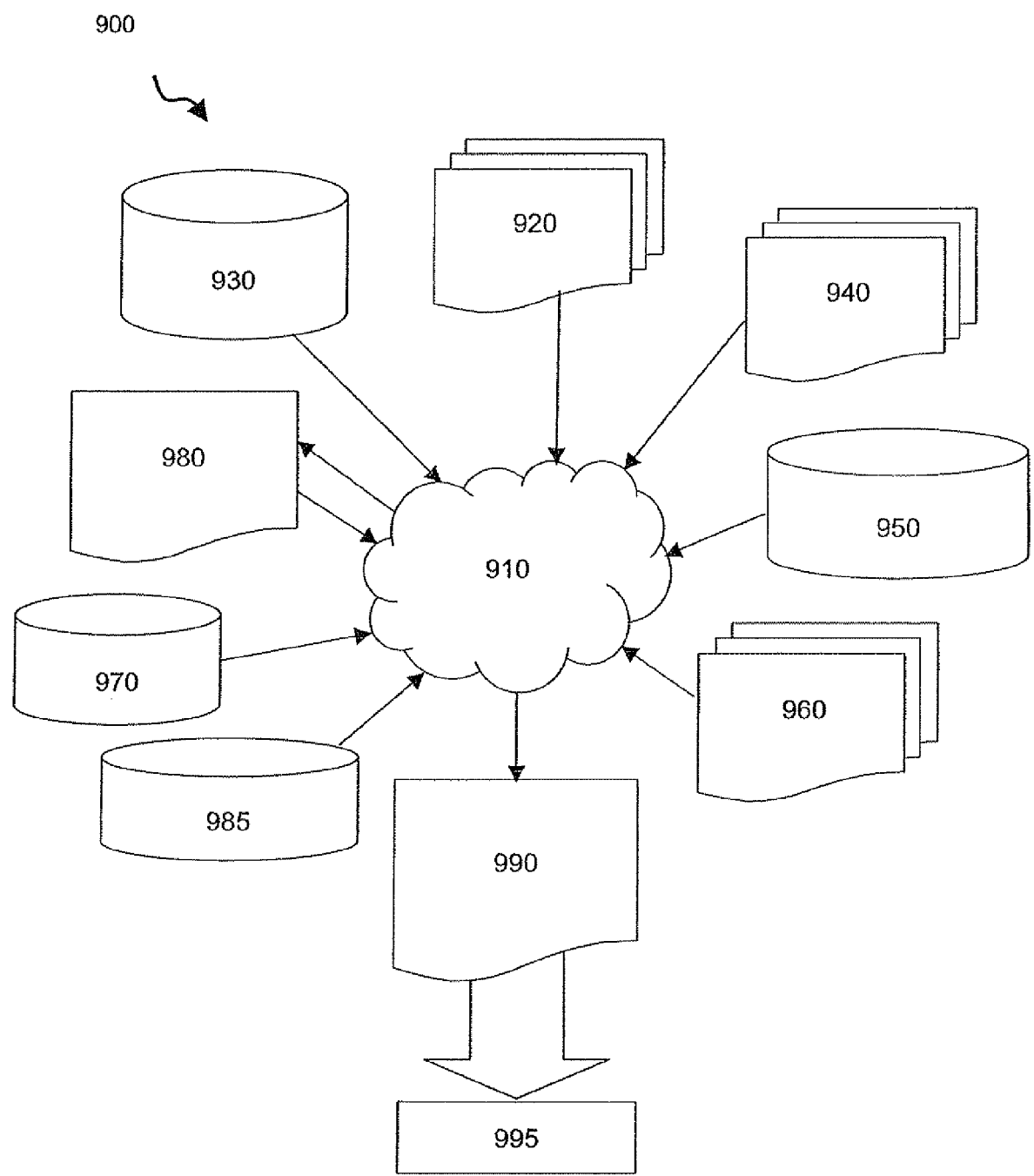
FIG. 5 is a flow diagram of a design process used in semiconductor designing, manufacturing and/or testing.

FIG. 5 shows a block diagram of an example design flow 900. Design flow 900 may vary depending on the type of IC being designed. For example, a design flow 900 for building an application specific IC (ASIC) may differ from a design flow 900 for designating a standard component. Design structure 920 is preferably an input to a design process 910 and may come from an IP provider, core developer, or other design company, or may be generated by the operator of the design flow, or from other sources. Design structure 920, as shown in FIGS. 1-4 comprises DRAM cell 100 and IC 401 (shown in FIGS. 1 and 2, respectively) in the form of schematics or HDL, a hardware-description language (e.g., Verilog, VHDL, C, etc.). Design structure 920 may be a text file or a graphical representation of the DRAM cell 100 and IC 401. Design process 910 preferably synthesizes (or translates) DRAM cell 100 and IC 401 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations for a given manufacturing technology (e.g., different technology nodes, 32 nm, 45 nm, 90 nm, etc.), design specifications 940, characterization data 950, verification data 960, design specifications 970, and test data files 985 (which may include test patterns and other testing information). Design process 910 may further include, for example, standard circuit design processes such as timing analysis, verification, design rule checking, place and route operations, etc. One of ordinary skill in the art of IC design can appreciate the extent of possible electronic design automation tools and applications used in design process 910 without deviating from the scope and spirit of the invention. The design structure of the invention is not limited to any specific design flow.

Design process 910 preferably translates embodiments of the invention, as shown in FIGS. 1-4, along with any additional integrated circuit design or data into a second design structure 990. Design structure 990 resides on a storage medium in a data format used for the exchange of layout data of integrated circuits (e.g., information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention, as shown in FIGS. 1-4. Design structure 990 may then proceed to a stage 995 where, for example, design structure 990: proceeds to tape-out, is released to manufacturing, is released to a mask house, is sent to another design house, is sent back to the customer, etc.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A design structure embodied in a machine readable medium, the design structure comprising:
   a memory array including a plurality of first DRAM cells connected to a first word line circuit and a bit line circuit or bit line bar circuit;
   a plurality of second DRAM cells connected to the bit line circuit or bit line bar circuit and a second word line circuit;
   a plurality of reference DRAM cells connected to a reference word line circuit and the bit line circuit or bit line bar circuit;
   a first power supply for supplying a bit line voltage to the DRAM cells, the bit line circuit, and the first word line;
   a second power supply for supplying a reference voltage to the reference DRAM cells and reference bit line circuit wherein the reference voltage is different from the bit line voltage;
   control logic communicating with the DRAM memory device and an integrated circuit (IC) for providing normal DRAM cycle operation and initiating a body refresh cycle, and the control logic generates a word line signal, a bit line control signal, a bit line bar control signal, and a reference word line signal;
   a sense amplifier circuit which amplifies the signal voltage at the bit line circuit and the bit line bar circuit; and
   the control logic adapted to generate the body refresh cycle periodically, wherein the voltage supplied to the first word line is deactivated while the bit line and bit line bar voltages continue, and the control logic is adapted to re-activate the first word line voltage.

2. The design structure of claim 1, wherein the reference word line circuit and bit line circuit communicate with the first word line circuit, and wherein the control logic amplifies the signal voltage.

3. The design structure of claim 1, wherein the design structure comprises a netlist which describes an integrated circuit (IC) and at least one of test data files, characterization data, verification data, or design specifications.

4. The design structure of claim 3, wherein the design structure resides on a storage medium as a data format used for the exchange of layout data of the IC.

5. A design structure embodied in a machine readable medium, the design structure comprising:
   a memory array including a plurality of first DRAM cells connected to a first word line circuit and a bit line circuit or bit line bar circuit;
   a plurality of second DRAM cells connected to the bit line circuit or bit line bar circuit and a second word line circuit;
   a plurality of reference DRAM cells connected to a reference word line circuit and the bit line circuit or bit line bar circuit;
   a first power supply for supplying a bit line voltage to the DRAM cells, the bit line circuit, and the first word line;
   a second power supply for supplying a reference voltage to the reference DRAM cells and reference bit line circuit wherein the reference voltage is different from the bit line voltage;
   control logic communicating with the DRAM memory device and an integrated circuit (IC) for providing normal DRAM cycle operation and initiating a body refresh cycle, and the control logic generates a word line signal, a bit line control signal, a bit line bar control signal, and a reference word line signal;
   a sense amplifier circuit which amplifies the signal voltage at the bit line circuit and the bit line bar circuit;
   the control logic adapted to generate the body refresh cycle periodically, wherein the voltage supplied to the first word line is deactivated while the bit line and bit line bar voltages continue, and the control logic is adapted to re-activate the first word line voltage; and
   wherein the reference word line circuit and bit line circuit communicate with the first word line circuit, and wherein the control logic communicates to the sense amplifier circuit to amplify the signal voltage.

6. The design structure of claim 5, wherein the design structure comprises a netlist which describes the IC and at least one of test data files, characterization data, verification data, or design specifications.

7. The design structure of claim 6, wherein the design structure resides on a storage medium as a data format used for the exchange of layout data of the IC.

* * * * *